United States Patent
Kim et al.

(10) Patent No.: US 10,504,528 B2
(45) Date of Patent: Dec. 10, 2019

(54) METHOD AND DEVICE FOR PROCESSING INTERNAL CHANNELS FOR LOW COMPLEXITY FORMAT CONVERSION

(71) Applicant: SAMSUNG ELECTRONICS CO., LTD., Suwon-si (KR)

(72) Inventors: Sun-min Kim, Yongin-si (KR); Sang-bae Chon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/736,809

(22) PCT Filed: Jun. 17, 2016

(86) PCT No.: PCT/KR2016/006494
§ 371 (c)(1),
(2) Date: Dec. 15, 2017

(87) PCT Pub. No.: WO2016/204580
PCT Pub. Date: Dec. 22, 2016

(65) Prior Publication Data
US 2018/0166083 A1    Jun. 14, 2018

Related U.S. Application Data

(60) Provisional application No. 62/181,112, filed on Jun. 17, 2015.

(51) Int. Cl.
*G10L 19/008*    (2013.01)
*H04N 21/233*    (2011.01)
(Continued)

(52) U.S. Cl.
CPC ............ *G10L 19/008* (2013.01); *H03G 5/165* (2013.01); *H04N 21/233* (2013.01);
(Continued)

(58) Field of Classification Search
CPC ..................................................... G10L 19/008
See application file for complete search history.

(56) References Cited

U.S. PATENT DOCUMENTS 8,325,929 B2   12/2012   Koppens et al.
9,257,127 B2    2/2016   Beack et al.
(Continued)

FOREIGN PATENT DOCUMENTS

CN    101553865 A    10/2009
CN    101911732 A    12/2010
(Continued)

OTHER PUBLICATIONS

Section 9.4. Spatial Audio Processing: MPEG Surround and Other Applications, by Jeroen Breebaart and Christof Faller, J. Wiley & Sons, 2007.*

(Continued)

*Primary Examiner* — Kile O Blair
(74) *Attorney, Agent, or Firm* — Sughrue Mion, PLLC (57) ABSTRACT

To address the technical problem, provided is a method of processing an audio signal, and the method including: receiving an audio bitstream that is encoded by using MPEG surround 212 (MPS212); obtaining internal channel gains with respect to one channel pair element (CPE) based on MPS212 parameters and rendering parameters about MPS212 output channels defined in a format converter; generating an internal channel signal with respect to the CPE based on the received audio bitstream and the obtained internal channel gains; and generating stereo output channel signals based on the generated internal channel signal.

5 Claims, 6 Drawing Sheets

(51) Int. Cl.
*H04N 21/439* (2011.01)
*H03G 5/16* (2006.01)
*H04S 3/00* (2006.01)

(52) U.S. Cl.
CPC ........... *H04N 21/439* (2013.01); *H04S 3/008* (2013.01); *H04S 2400/03* (2013.01)

(56) References Cited

U.S. PATENT DOCUMENTS

| | | |
|---|---|---|
| 9,369,164 B2 | 6/2016 | Kim et al. |
| 9,514,758 B2 | 12/2016 | Oh et al. |
| 9,697,077 B2 | 7/2017 | Sokolov et al. |
| 2008/0049943 A1 | 2/2008 | Faller et al. |
| 2010/0121647 A1* | 5/2010 | Beack ................... G10L 19/008 704/500 |
| 2011/0166867 A1* | 7/2011 | Seo ......................... G10L 19/20 704/500 |
| 2011/0264456 A1 | 10/2011 | Koppens et al. |
| 2014/0016785 A1 | 1/2014 | Neuendorf et al. |
| 2015/0194158 A1 | 7/2015 | Oh et al. |
| 2016/0104491 A1 | 4/2016 | Lee et al. |
| 2017/0047071 A1* | 2/2017 | Melkote ................ G10L 19/008 |

FOREIGN PATENT DOCUMENTS

| | | |
|---|---|---|
| CN | 102187691 A | 9/2011 |
| KR | 10-2012-0099191 A | 9/2012 |
| KR | 10-2013-0007527 A | 1/2013 |
| KR | 10-2014-0017342 A | 2/2014 |
| KR | 10-2015-0011783 A | 2/2015 |
| WO | 2008069596 A1 | 6/2008 |
| WO | 2014/175669 A1 | 10/2014 |
| WO | 2016/204579 A1 | 12/2016 |
| WO | 2016/204581 A1 | 12/2016 |
| WO | 2016/204583 A1 | 12/2016 |

OTHER PUBLICATIONS

International Search Report and Written Opinion issued by the International Searching Authority dated Sep. 6, 2016 in counterpart International Application No. PCT/KR2016/006494 (PCT/ISA/210 & PCT/ISA/237).

Communication issued by the European Patent Office dated Feb. 20, 2018 in counterpart European Patent Application No. 16811993.1.

Chon et al., "Proposed Internal Channel for Low Complexity Format Conversion", International Organization for Standardization, MPEG Meeting (Motion Picture Expert Group or ISO/IEC JTC1/SC29/WG11) Jun. 22-Jun. 26, 2015, Warsaw, Poland, Jun. 18, 2015, No. m36447, XP030064815.

Communication dated Sep. 17, 2019, issued by the State Intellectual Property Office of People's Republic of China in counterpart Chinese Application No. 201680035700.1.

* cited by examiner

[Table 1]

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 2 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 3 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 4 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 5 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 6 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 7 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 8 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 9 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 10 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 11 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 12 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 13 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 14 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 15 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 16 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 17 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 18 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 19 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |
| 20 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 21 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 22 | 1 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 |
| 23 | 0 | 1 | 1 | 1 | 0 | 1 | 0 | 1 | 1 | 1 | 0 | 1 | 0 | 1 | 1 | 1 | 0 | 1 | 0 | 1 | 1 | 1 | 0 | 1 |

METHOD AND DEVICE FOR PROCESSING INTERNAL CHANNELS FOR LOW COMPLEXITY FORMAT CONVERSION

TECHNICAL FIELD

The present inventive concept relates to a method and apparatus for internal channel processing for low complexity format conversion, and more particularly, to a method and apparatus for reducing the number of times covariance calculations are performed in a format converter by performing an internal channel process with respect to input channels in a stereo output layout environment to reduce the number of input channels of the format converter.

BACKGROUND ART

MPEG-H 3D Audio may process various kinds of signals, and may easily control input/output formats in order to function as a next generation solution for processing audio signals. Also, according to a tendency toward miniaturization of devices and recent trends, a rate of reproduction of audio through a mobile device having a stereo reproduction environment increases in an entire audio reproduction environment.

When an immersive audio signal realized through multi-channels, e.g., 22.2 channels, is transferred to a stereo reproduction system, all input channels have to be decoded and the immersive audio signal has to be downmixed to be converted into a stereo format.

As the number of input channels increases and as the number of output channels decreases, a complexity of a decoder that is necessary for analysis of covariance and phase matching increases. Such an increase in the complexity largely affects consumption of a battery, as well as an operating speed, in a mobile device.

DETAILED DESCRIPTION OF THE INVENTION

Technical Problem

As described above, in an environment in which the number of input channels increases to provide immersive sound while the number of output channels decreases to improve portability, complexity in format conversion matters during decoding operations increases.

The present inventive concept addresses the above problems of the related art, and reduces format conversion complexity in a decoder.

Technical solution

Representative configurations for achieving the aforementioned objects of the present inventive concept are presented as follows.

According to an aspect of the present inventive concept, there is provided a method of processing an audio signal, the method including: receiving an audio bitstream that is encoded by using MPEG surround 212 (MPS212); obtaining internal channel gains with respect to one channel pair element (CPE) based on MPS212 parameters and rendering parameters about MPS212 output channels defined in a format converter; generating an internal channel signal with respect to the CPE based on the received audio bitstream and the obtained internal channel gains; and generating stereo output channel signals based on the generated internal channel signal.

According to another aspect of the present inventive concept, there is provided an apparatus for processing an audio signal, the apparatus including: a receiver configured to receive an audio bitstream that is encoded by using an MPEG surround 212 (MPS212); an internal channel processor configured to obtain internal channel gains with respect to one channel pair element (CPE) based on MPS212 parameters and rendering parameters about MPS212 output channels defined in a format converter, and to generate an internal channel signal with respect to the CPE based on the received audio bitstream and the obtained internal channel gains; and a stereo output signal generator configured to generate stereo output channel signals based on the generated internal channel signal.

According to another aspect of the present inventive concept, the internal channel gains $G_{ICH}^{l,m}$ may be determined by using $$G_{ICH}^{l,m} = \sqrt{\left(c_{left}^{l,m} \times G_{left} \times G_{EQ,left}^{m}\right)^2 + \left(c_{right}^{l,m} \times G_{right} \times G_{EQ,right}^{m}\right)^2},$$

where l denotes a time slot index and m denotes a frequency band index, $c_{left}^{l,m}$ and $c_{right}^{l,m}$ are channel level difference (CLD) values of an l-th time slot of the MPS212 parameters, $G_{left}$ and $G_{right}$ are panning gain values among the rendering parameters, and $G_{EQ,left}^{m}$ and $G_{EQ,right}^{m}$ are equalization (EQ) gain values of an m-th frequency band among the rendering parameters.

According to another aspect of the present inventive concept, the audio signal may be an immersive audio signal.

According to another aspect of the present inventive concept, a non-transitory computer-readable recording medium having recorded thereon a program, which when executed by a computer, performs the above method.

In addition, there is further provided a non-transitory computer-readable recording medium having recorded thereon a program, which when executed by a computer, performs other methods, other systems for implementing the present inventive concept, and the above method.

Advantageous Effects of the Invention

According to the present inventive concept, the number of channels input to a format converter is reduced by using internal channels, and then, complexity of the format converter may be reduced. In more detail, since the number of channels input to the format converter decreases, covariance analysis performed in the format converter may be simplified and complexity may be reduced.

Also, a calculation amount may be further reduced by using an internal channel gain based on channel level difference (CLD) data and rendering parameters.

Table 2 shows a mixing matrix of a format converter that renders a 22.2-channel immersive audio signal into a stereo signal by using an internal channel.

Table 3 shows a CPE structure for configuring 22.2 channels into an internal channel, according to an embodiment of the present inventive concept.

Table 4 shows types of internal channels corresponding to decoder input channels, according to an embodiment of the present inventive concept.

Table 5 shows locations of channels that are additionally defined according to an internal channel type, according to an embodiment of the present inventive concept.

Table 6 shows a format converter output channel corresponding to an internal channel type, and a gain and an equalization (EQ) index to be applied to each output channel, according to an embodiment.

Table 7 shows speakerLayoutType according to an embodiment of the present inventive concept.

Table 8 shows syntax of SpeakerConfig3d( ) according to an embodiment of the present inventive concept.

Table 9 shows immersiveDownmixFlag according to an embodiment of the present inventive concept.

Table 10 shows syntax of SAOC3DgetNumChannels( ) according to an embodiment of the present inventive concept.

Table 11 shows a channel allocation order according to an embodiment of the present inventive concept.

Table 12 shows syntax of mpegh3daChannelPairElementConfig( ) according to an embodiment of the present inventive concept.

BEST MODE

To address the above technical problem, there is provided a method of processing an audio signal, the method including: receiving an audio bitstream that is encoded by using MPEG surround 212 (MPS212); obtaining internal channel gains with respect to one channel pair element (CPE) based on MPS212 parameters and rendering parameters about MPS212 output channels defined in a format converter; generating an internal channel signal with respect to the CPE based on the received audio bitstream and the obtained internal channel gains; and generating stereo output channel signals based on the generated internal channel signal.

MODE OF THE INVENTION

In the following detailed description of the present invention, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different from each other, are not necessarily mutually exclusive.

For example, specific shapes, structures, and characteristics described herein may be implemented as modified from one embodiment to another without departing from the spirit and scope of the invention. In addition, the positions or arrangement of elements described in one exemplary embodiment may be changed in another exemplary embodiment within the scope of the present invention. Therefore, the following detailed description is not to be taken in a limiting sense, and the scope of the invention, if properly described, is limited only by the appended claims and all equivalents thereof.

In the drawings, like or similar reference numerals denote like or similar elements. In addition, components irrelevant with the description are omitted in the drawings for clear description, and like reference numerals are used for similar components throughout the entire specification.

Hereinafter, preferred embodiments of the present invention will be described in detail with reference to the accompanying drawings so that those skilled in the art to which the invention pertains can easily carry out the present invention. However, the present disclosure may be implemented in various manners, and is not limited to one or more embodiments described herein.

Moreover, when it is mentioned that a part is "connected" with another part, it means not only "direct connection" but also "electrical connection" with different elements interposed between the two parts. Throughout the specification, when a portion "includes" an element, another element may be further included, rather than excluding the existence of the other element, unless otherwise described.

The definition of main terms used in the detailed description of the invention is as follows.

An internal channel (IC) is a virtual intermediate channel used during a format conversion process in order to remove unnecessary operation occurring in MPEG Surround stereo (MPS212) upmixing and format converter (FC) downmixing, and considers a stereo output.

An internal channel signal is a mono-signal mixed in a format converter in order to provide a stereo signal, and is generated by using an internal channel gain.

An internal channel processing denotes a process of generating an internal channel signal based on an MPS212 decoding block, and is performed in an internal channel processing block.

An internal channel gain (ICG) denotes a gain calculated from a channel level difference (CLD) value and format conversion parameters, and applied to an internal channel signal.

An internal channel group denotes a type of internal channel determined based on a location of a core codec output channel, and the core codec output channel location and the internal channel group are defined in Table 4 (described later).

Hereinafter, the present invention will be described in detail with reference to accompanying drawings.

Figure 1:
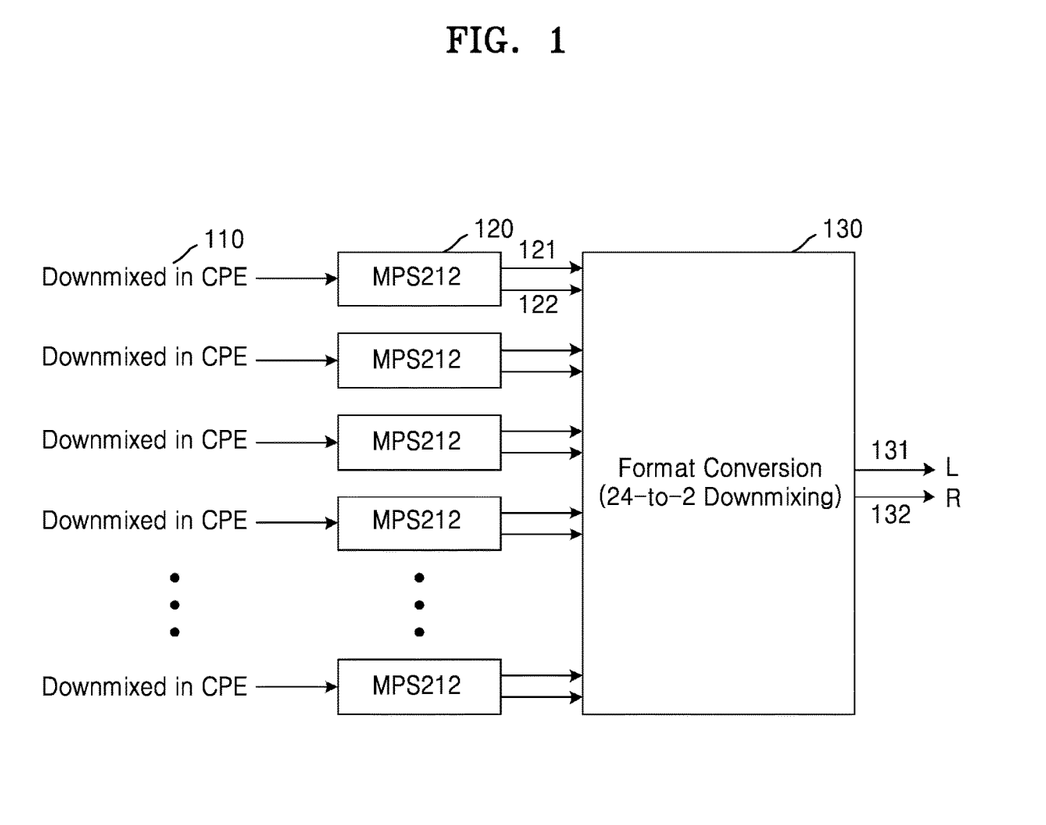
FIG. 1 is a diagram of a decoding structure for converting a format of 24 input channels into stereo output channels, according to an embodiment.

FIG. 1 is a diagram of a decoding structure for converting format of 24 input channels into stereo output channels according to an embodiment.

When a bitstream of multi-channel inputs is transferred to a decoder, an input channel layout is downmixed in the decoder to be suitable for an output channel layout of a reproduction system. For example, when a 22.2-channel input signal according to the MPEG standard is reproduced by a stereo channel output system as shown in FIG. 1, a format converter 130 included in the decoder downmixes layout of 24 input channels into layout of two output channels according to rules of the format converter regulated therein.

Here, the 22.2-channel input signal input to the decoder includes CPE bitstreams 110 in which signals with respect to two channels included in one channel pair element (CPE) are downmixed. Since the CPE bitstream is encoded by using MPS212, the received CPE bitstream is decoded by using an MPS212 120. Here, a low frequency effect (LFE) channel, that is, a woofer channel, is not configured as a CPE. Therefore, a decoder input signal in a case of the 22.2-channel input includes bitstreams with respect to 11 CPEs and bitstreams with respect to two woofer channels.

When the MPS212 decoding is performed on the CPE bitstreams included in the 22.2-channel input signal, two MPS212 output channels 121 and 122 with respect to each CPE are generated, and the output channels 121 and 122 decoded by using the MPS212 become input channels of the format converter. In the example of FIG. 1, the number of input channels Nin of the format converter is 24 including the woofer channels. Therefore, 24*2 downmixing has to be performed in the format converter.

In the format converter, a phase alignment according to an analysis of covariance is performed in order to prevent timbral distortion caused by a phase difference between multi-channel signals. Here, a covariance matrix has a Nin×Nin dimensions, and thus, complex multiplication has to be performed (Nin×(Nin−1)/2+Nin)×71band×2×16× (48000/2048) times theoretically in order to analyze the covariance matrix.

When the number of input channels Nin is 24, four calculations have to be performed to execute one complex number multiplication, and a performance of about 64 MOPS (million operations per second) is necessary.

Figure 6:
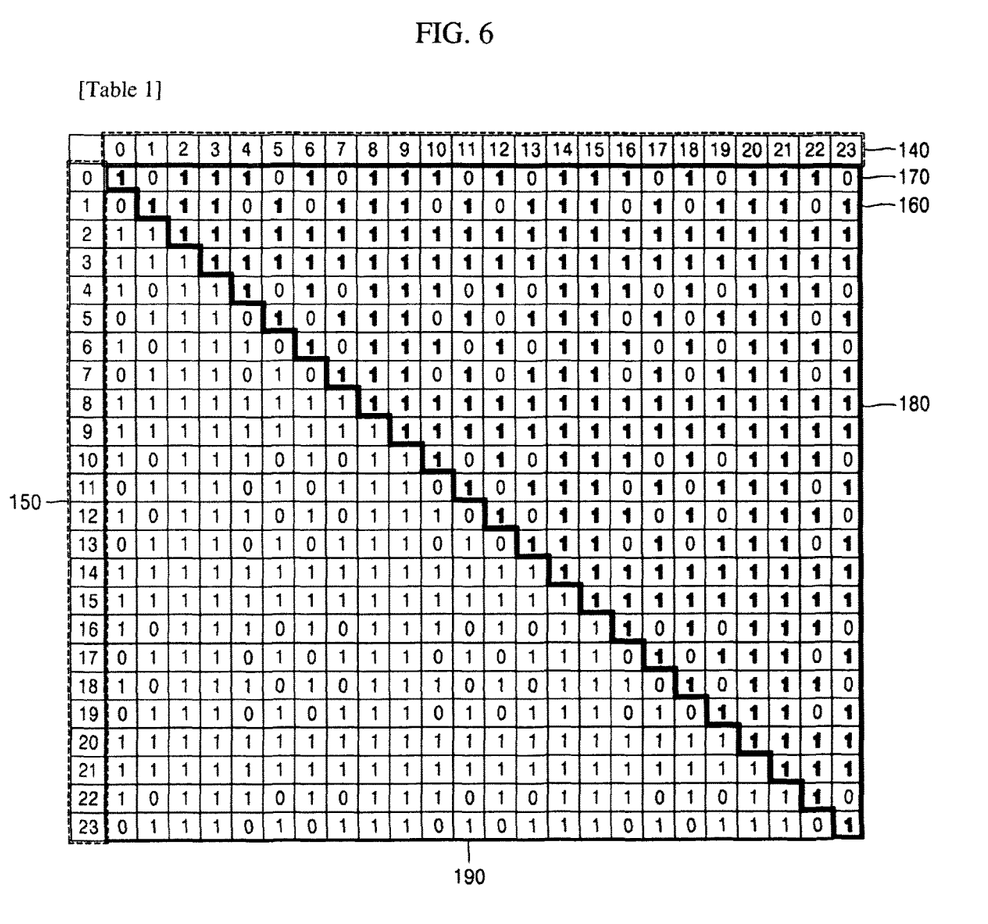
FIG. 6 depicts Table 1 showing a mixing matrix of a format converter that renders a 22.2-channel immersive audio signal into a stereo signal, according to an embodiment.

Referring to FIG. 6, Table 1 shows a mixing matrix of a format converter that renders 22.2-channel immersive audio signal into a stereo signal, according to an embodiment.

In the mixing matrix of Table 1, a transverse axis 140 and a longitudinal axis 150 denote 24 input channels that are numbered, and an order of numbering the 24 input channels does not have a significant meaning in the analysis of covariance. In the embodiment shown in Table 1, each element of the mixing matrix has a value of 1 (160), the analysis of covariance is necessary, but when each element of the mixing matrix has a value of 0 (170), the analysis of covariance may be omitted.

For example, in a case of the input channels that are not mixed with each other during the format conversion to the stereo output layout, e.g., CM_M_L030 and CH_M_R030, values of the corresponding elements in the mixing matrix become 0 and the analysis of covariance between the CM_M_L030 and CH_M_R030 channels that are not mixed with each other may be omitted.

Therefore, 128 times of covariance analysis with respect to the input channels that are not mixed with one another may be excluded from 24×24 times of analysis of covariance.

Also, the mixing matrix has a symmetrical structure according to input channels, and thus, a lower portion 190 and an upper portion 180 are partitioned based on a diagonal line in Table 1 and the analysis of covariance with respect to the lower portion 190 may be omitted. Also, since the analysis of covariance is only performed with respect to parts expressed in bold letters in the upper portion based on the diagonal line, the analysis of covariance is finally performed 236 times.

As described above, when unnecessary analysis of covariance is removed in a case where the mixing matrix has a value of 0 (channels not mixed with each other) and by using symmetricity of the mixing matrix, the analysis of covariance includes the complex number multiplication performed 236×71band×2×16×(48000/2048) times.

Therefore, a performance of 50 MOPS is necessary in the above case, load to the system caused by the analysis of covariance may be improved when comparing to a case where the analysis of covariance is performed with respect to entire mixing matrix.

Figure 2:
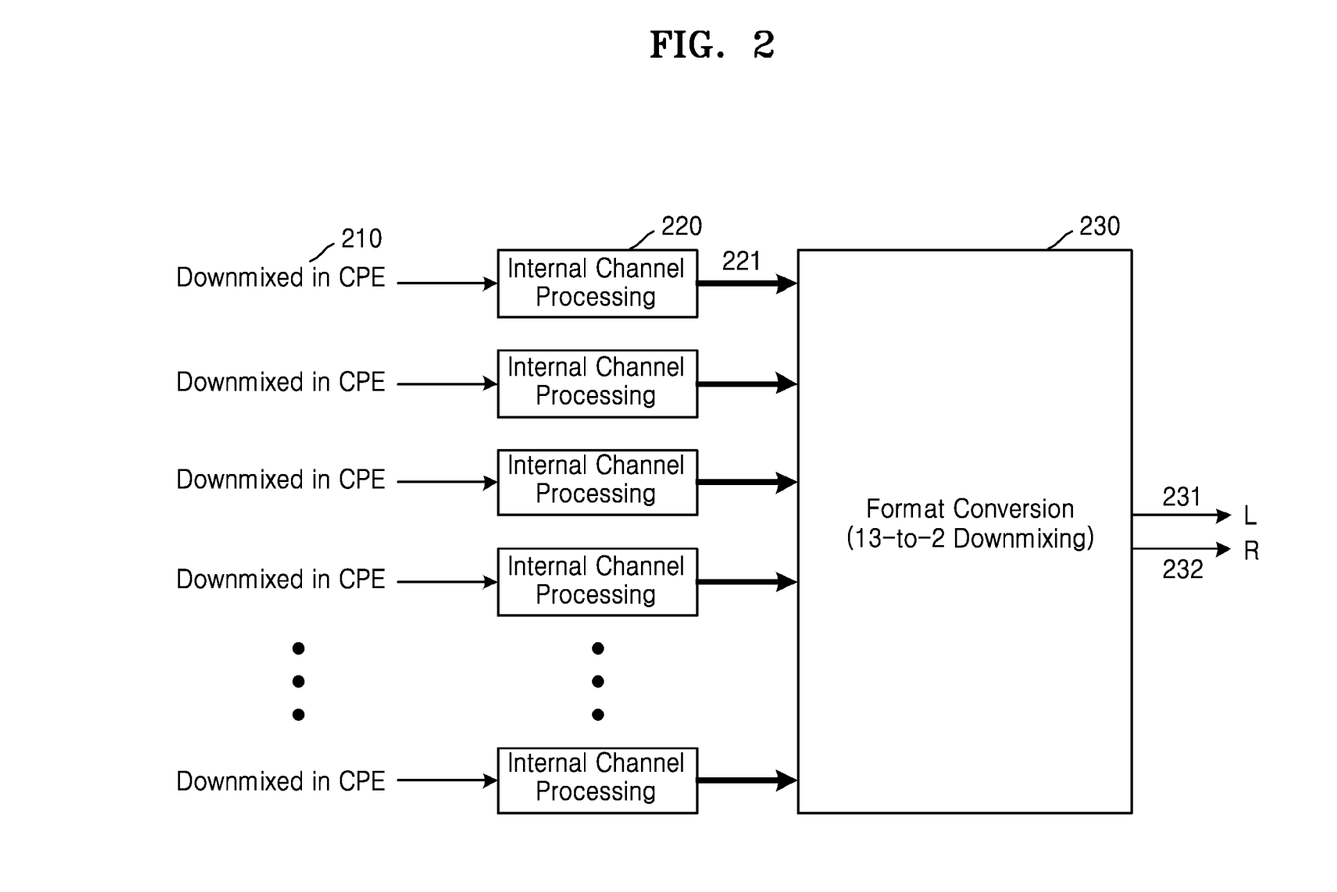
FIG. 2 is a diagram of a decoding structure for converting a format from a 22.2-channel immersive audio signal into stereo output channels by using 13 internal channels, according to an embodiment.

FIG. 2 is a diagram of a decoding structure for converting format of 22.2-channel immersive audio signal into stereo output channels by using 13 internal channels, according to an embodiment.

In addition, the MPEG-H 3D audio uses the CPE in order to effectively transfer a multi-channel audio signal in a restricted transferring environment. When two channels corresponding to one pair of channels are mixed as the stereo layout, an inter-channel correlation (ICC) is set as 1 and a decorrelator is not applied, and thus, two channels may have the same phase information as each other.

That is, when the pair of channels included in each CPE is determined taking into account the stereo output, the pair of channels that are upmixed may have an equal panning coefficient (will be described later).

One internal channel is generated by mixing two in-phase channels included in one CPE. One internal channel signal is downmixed based on a mixing gain and an equalization (EQ) value according to format conversion rules in a case where two input channels included in the internal channel are converted into the stereo output channels. Here, the pair of channels included in one CPE are in-phase channels, and thus, a process of aligning phases between the channels after the downmixing is not necessary.

Although the stereo output signals of the MPS212 upmixer have no phase difference, the embodiment illustrated in FIG. 1 does not take into account the same phase, the complexity unnecessarily increases. If the reproduction layout is stereo type, one internal channel may be used instead of using the upmixed pair of CPE channels as an input to the format converter, the number of input channels of the format converter may be reduced.

In the embodiment illustrated with reference to FIG. 2, instead of the process of generating two channels by performing MPS 212 upmixing on a CPE bitstream 210, the CPE bitstream is internal channel-processed (220) to generate one internal channel 221. Here, the woofer channel is not configured as the CPE, each woofer channel signal becomes the internal channel signal.

In a case of 22.2 channels in the embodiment illustrated with reference to FIG. 2, internal channels Nin=13 are the input channels of the format converter, wherein the internal channels include internal channels for 11 CPEs of the 22 general channels and internal channels for two woofer channels. Therefore, downmixing is performed 13*2 times in the format converter.

In the stereo reproduction layout as described above, unnecessary processes that occurs during upmixing through the MPS212 and downmixing again through the format conversion may be additionally removed by using the internal channels, and thus, complexity of the decoder may further reduced.

In a case where the mixing matrix $M_{Mix}(i,j)$ with respect to two output channels i and j of one CPE has a value of 1, the inter-channel correlation ICC is set as $ICC^{l,m}=1$, and the decorrelation and residual processes may be omitted.

The internal channel is defined as a virtual intermediate channel corresponding to an input to the format converter. As shown in FIG. 2, each internal channel processing block 220 generates an internal channel signal by using MPS212 payload such as CLD, and rendering parameters such as EQ and gain values. Here, the EQ and the gain values denote rendering parameters about output channels of an MPS212 block, defined in the conversion rule table of the format converter.

Table 2 shows a mixing matrix of a format converter that renders a 22.2-channel immersive audio signal into a stereo signal by using an internal channel.

TABLE 2

|   | A | B | C | D | E | F | G | H | I | J | K | L | M |
|---|---|---|---|---|---|---|---|---|---|---|---|---|---|
| A | 1 | 1 | 1 | 1 | 1 | 1 | 1 | 1 | 1 | 1 | 1 | 1 | 1 |
| B | 1 | 1 | 1 | 1 | 1 | 1 | 1 | 1 | 1 | 1 | 1 | 1 | 1 |
| C | 1 | 1 | 1 | 1 | 1 | 1 | 1 | 1 | 1 | 1 | 1 | 1 | 1 |
| D | 1 | 1 | 1 | 1 | 1 | 1 | 1 | 1 | 1 | 1 | 1 | 1 | 1 |
| E | 1 | 1 | 1 | 1 | 1 | 1 | 1 | 1 | 1 | 1 | 1 | 1 | 1 |
| F | 1 | 1 | 1 | 1 | 1 | 1 | 1 | 1 | 1 | 0 | 0 | 0 | 0 |
| G | 1 | 1 | 1 | 1 | 1 | 1 | 1 | 1 | 1 | 0 | 0 | 0 | 0 |
| H | 1 | 1 | 1 | 1 | 1 | 1 | 1 | 1 | 1 | 0 | 0 | 0 | 0 |
| I | 1 | 1 | 1 | 1 | 1 | 1 | 1 | 1 | 1 | 0 | 0 | 0 | 0 |
| J | 1 | 1 | 1 | 1 | 1 | 0 | 0 | 0 | 0 | 1 | 1 | 1 | 1 |
| K | 1 | 1 | 1 | 1 | 1 | 0 | 0 | 0 | 0 | 1 | 1 | 1 | 1 |
| L | 1 | 1 | 1 | 1 | 1 | 0 | 0 | 0 | 0 | 1 | 1 | 1 | 1 |
| M | 1 | 1 | 1 | 1 | 1 | 0 | 0 | 0 | 0 | 1 | 1 | 1 | 1 |

Like in Table 1 above, in the mixing matrix of Table 2, a transverse axis and a longitudinal axis denote indexes of input channels, and an order thereof is not important in the analysis of covariance.

As described above, since the mixing matrix has a symmetric characteristic based on the diagonal line, an upper portion or a lower portion based on the diagonal line in the mixing matrix of Table 2 may be selected in order to omit the analysis of covariance with respect to some part. Also, the analysis of covariance with respect to the input channels that are not mixed during the format conversion process to the stereo output layout may be also omitted.

However, unlike the embodiment illustrated in Table 1, according to the embodiment illustrated in Table 2, 11 internal channels including 22 general channels and two woofer channels, that is, 13 channels, are downmixed to the stereo output channels, and the number of input channels $N_{in}$ of the format converter is 13.

As a result, according to the embodiment using the internal channels as in Table 2, the analysis of covariance is performed 75 times and a performance of 19 MOPS is theoretically necessary, and thus, a load to the format converter due to the analysis of covariance may be greatly reduced when being compared with a case in which the internal channels are not used.

The format converter has a downmix matrix $M_{Dmx}$ for downmixing, and the mixing matrix $M_{mix}$ calculated by using $M_{Dmx}$ as follows.

$$M_{Mix} = \text{zero } N_{in} \times N_{in} \text{ Matrix}$$
$$\text{for } i = 1 \text{ to } N_{out}$$
$$\quad \text{for } j = 1 \text{ to } N_{in}$$
$$\quad\quad \text{set\_i} = 0$$
$$\quad\quad \text{if } M_{Dmx}(i, j) > 0.0$$
$$\quad\quad\quad \text{set\_i} = 1$$
$$\quad\quad \text{end}$$
$$\quad\quad \text{for } k = 1 \text{ to } N_{in}$$
$$\quad\quad\quad \text{set\_k} = 0$$

-continued $$\quad\quad\quad \text{if } M_{Dmx}(i, j) > 0.0$$
$$\quad\quad\quad\quad \text{set\_k} = 1$$
$$\quad\quad\quad \text{end}$$
$$\quad\quad\quad \text{if set\_i} == 1 \text{ and set\_k} == 1$$
$$\quad\quad\quad\quad M_{Mix}(j, k) = 1$$
$$\quad\quad\quad \text{end}$$
$$\quad\quad \text{end}$$
$$\quad \text{end}$$

Each OTT decoding block outputs two channels corresponding to channel numbers i and j, and when the mixing matrix $M_{Mix}(i,j)$ is 1, the ICC is set as $ICC_{l,m}=1$ and $H11_{OTT}^{l,m}$ and $H21_{OTT}^{l,m}$ of an upmix matrix $R_2^{l,m}$ are calculated, and thus, the decorrelator is not used.

Table 3 shows a CPE structure for configuring 22.2 channels into an internal channel, according to an embodiment of the present invention.

When a bitstream of 22.2 channels has a structure as shown in Table 3, 13 internal channels may be defined as ICH_A to ICH_M, and a mixing matrix for the 13 internal channels may be determined as shown in Table 2.

A first column of Table 3 denotes indexes of input channels, and a first row denotes whether the input channels configure the CPE, mixing gains to the stereo channels, and internal channel indexes.

TABLE 3

| Input Channel | Element | Mixing Gain to L | Mixing Gain to R | Internal Channel |
|---|---|---|---|---|
| CH_M_000 CH_L_000 | CPE | 0.707 | 0.707 | ICH_A |
| CH_U_000 CH_T_000 | CPE | 0.707 | 0.707 | ICH_B |
| CU_M_180 CH_U_180 | CPE | 0.707 | 0.707 | ICH_C |
| CH_LFE2 | LFE | 0.707 | 0.707 | ICH_D |
| CH_LFE3 | LFE | 0.707 | 0.707 | ICH_E |
| CH_M_L135 CH_U_L135 | CPE | 1 | 0 | ICH_F |
| CH_M_L030 CH_L_L045 | CPE | 1 | 0 | ICH_G |
| CH_M_L090 CH_U_L090 | CPE | 1 | 0 | ICH_H |
| CH_M_L060 CH_U_L045 | CPE | 1 | 0 | ICH_I |
| CH_M_R135 CH_U_R135 | CPE | 0 | 1 | ICH_J |
| CH_M_R030 CH_L_R045 | CPE | 0 | 1 | ICH_K |
| CH_M_R090 CH_U_R090 | CPE | 0 | 1 | ICH_L |
| CH_M_R060 CH_U_R045 | CPE | 0 | 1 | ICH_M |

For example, in a case of an ICH_A internal channel in which CM_M_000 and CM_L_000 are configured as one CPE, a mixing gain applied to a left output channel and a mixing gain applied to a right output channel both have a value of 0.707 for upmixing the CPE into the stereo output channels. That is, signals upmixed to the left output channel and the right output channel are reproduced at an equal magnitude.

Otherwise, in a case of an ICH_F internal channel in which CH_M_L135 and CH_U_L135 are configured as one CPE, a mixing gain applied to the left output channel has a value of 1 and a mixing gain applied to the right output channel has a value of 0 for upmixing the CPE to the stereo output channels. That is, all signals are only reproduced through the left output channel, and are not reproduced through the right output channel.

On the other hand, in a case of an ICH_J internal channel in which CH_M_R135 and CH_U_R135 are configured as one CPE, a mixing gain applied to the left output channel has a value of 0 and a mixing gain applied to the right output channel has a value of 1 for upmixing the CPE to the stereo output channels. That is, all signals are not reproduced through the left output channel, and are only reproduced through the right output channel.

Figure 3:
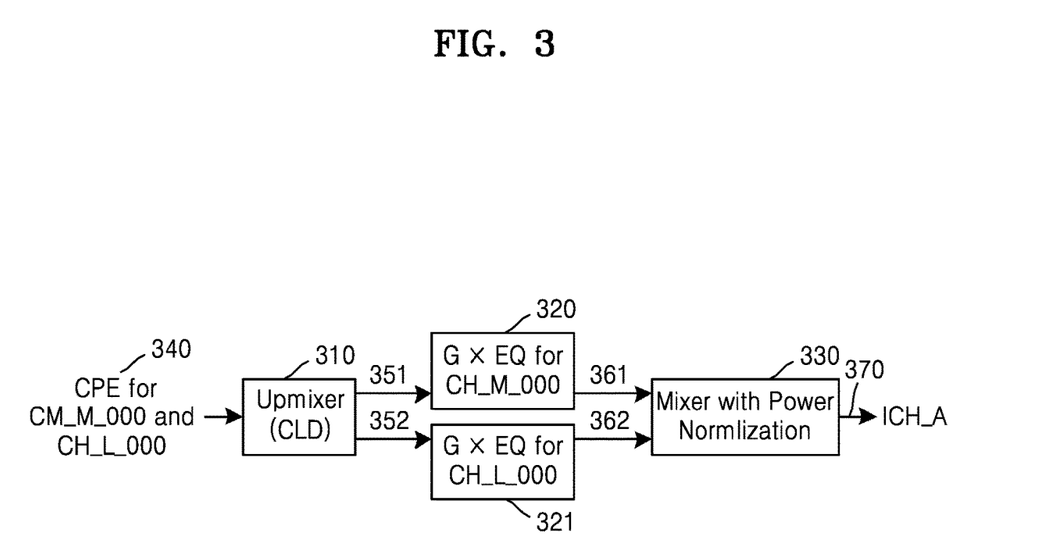
FIG. 3 is a diagram showing generation of one internal channel from one channel pair element (CPE), according to an embodiment.

FIG. 3 is a diagram showing a device generating one internal channel from one CPE according to an embodiment.

An internal channel of one CPE may be induced by applying format conversion parameters of a QMF domain such as CLD, gain, and EQ to a downmixed mono-signal.

The device for generating the internal channel shown in FIG. 3 includes an upmixer 310, a scaler 320, and a mixer 330.

When it is assumed that a CPE 340 in which signals with respect to a pair of CH_M_000 and CH_L_000 channels are downmixed is input, the upmixer 310 upmixes the CPE signal by using a CLD parameter. The CPE signal passed through the upmixer 310 is upmixed to a signal 351 about CH_M_000 and a signal 352 about CH_L_000, and phases of the upmixed signals are maintained equal to each other and the signals may be mixed together in the format converter.

Each of the upmixed CH_M_000 channel signal and CH_L_000 channel signal is scaled (320 and 321) by a gain and an EQ corresponding to the conversion rules defined in the format converter with respect to each sub-band.

When signals 361 and 362 that are scaled with respect to the pair of channels CH_M_000 and CH_L_000 are generated, the mixer 330 mixes the scaled signals 361 and 362 and regulates power of the mixed signals to generate an internal channel signal ICH_A 370 that is an intermediate channel signal for the format conversion.

Here, in a case of a single channel element (SCE) and woofer channels that are not upmixed by using the CLD, internal channels are equal to original input channels.

A core codec output using the internal channels is performed in a hybrid quadrature mirror filter (QMF) domain, and thus, a process of ISO IEC23308-3 10.3.5.2 is not performed. In order to allocate each channel of a core coder, additional channel allocation rules and downmix rules as shown in Table 4 to Table 6 are defined.

Table 4 shows types of internal channels corresponding to decoder input channels, according to an embodiment of the present invention.

The internal channel corresponds to an intermediate channel between the core coder and an input channel of the format converter, and has four types, e.g., a woofer channel, a center channel, a left channel, and a right channel.

Also, the internal channel may be panned to a left channel and a right channel among the stereo output channels, as (1,0), (0,1) or (0.707, 0.707).

If a pair of channels of each type expressed as a CPE are equal internal channel type, the internal channel may be used because the format converter has the same panning coefficient and the same mixing matrix. That is, in a case where the pair of channels included in the CPE have the same internal channel types, the internal channel processing may be performed, and thus, the CPE needs to be configured to have the channels having the same internal channel types.

When the decoder input channel corresponds to the woofer channel, that is, CH_LFE_1, CH__LFE_2, or CH_LFE_3, the internal channel type is determined as CH_I_LFE that is the woofer channel.

When the decoder input channel corresponds to the center channel, that is, CH_M_000, CH_L_000, CH_U_000, CH_T_000, CH_M_180, or CH_U_180, the internal channel type is determined as CH_I_CNTR that is the center channel.

When the internal channel type is CH_I_CNTR or CH_I_LFE, left and right panning corresponds to (0.707, 0.707), and thus, an output signal is reproduced through an L channel and an R channel among the output channels, an L channel signal and an R channel signal have an equivalent magnitude, and a signal after the format conversion has an equal energy level as that of a signal before the format conversion. However, an LFE channel is not upmixed from the CPE, but is independently encoded from the LFE.

When the decoder input channel corresponds to the left channel, that is, CH_M_L022, CH_M_L030, CH_M_L045, CH_M_L060, CH_M_L090, CH_M_L110, CH_M_L135, CH_M_L150, CH_L_L045, CH_U_L045, CH_U_L030, CH_U_L045, CH_U_L090, CH_U_L110, CH_U_L135, CH_M_LSCR, or CH_M_LSCH, the internal channel type is determined as the left channel, e.g., CH_I_LEFT.

When the internal channel type is CH_I_LEFT, the left and right panning corresponds to (1,0), and thus, the output signal is reproduced through the L channel among the stereo output channels, and the signal before and after the format conversion has an equal energy level.

When the decoder input channel corresponds to the right channel, that is, CH_M_R022, CH_M_R030, CH_M_L045, CH_M_R060, CH_M_R090, CH_M_R110, CH_M_R135, CH_M_R150, CH_L_R045, CH_U_R045, CH_U_R030, CH_U_R045, CH_U_R090, CH_U_R110, CH_U_R135, CH_M_RSCR, or CH_M_RSCH, the internal channel type is determined as the right channel, e.g., CH_I_RIGHT.

TABLE 4

| Type | Channels | Panning (L, R) |
| --- | --- | --- |
| CH-I-LFE | CH_LFE1, CH_LFE2, CH_LFE3 | (0.707, 0.707) |
| CH-I-CNTR | CH_M_000, CH_L_000, CH_U_000, CH_T_000, CH_M_180, CH_U_180 | (0.707, 0.707) |
| CH-I-LEFT | CH_M_L022, CH_M_L030, CH_M_L045, CH_M_L060, CH_M_L090, CH_M_L110, CH_M_L135, CH_M_L150, CH_L_L045, CH_U_L045, CH_U_L030, CH_U_L045, CH_U_L090, CH_U_L110, CH_U_L135, CH_M_LSCR, CH_M_LSCH | (1, 0) |
| CH-R-RIGHT | CH_M_R022, CH_M_R030, CH_M_R045, CH_M_R060, CH_M_R090, CH_M_R110, CH_M_R135, CH_M_R150, CH_L_R045, CH_U_R045, CH_U_R030, CH_U_R045, CH_U_R090, CH_U_R110, CH_U_R135, CH_M_RSCR, CH_M_RSCH | (0, 1) |

When the internal channel type is CH_I_RIGHT, the left and right panning corresponds to (0,1), and thus, the output signal is reproduced through the R channel among the stereo output channels, and the signal before and after the format conversion has an equal energy level.

Table 5 shows locations of channels that are additionally defined according to an internal channel type, according to an embodiment of the present invention.

TABLE 5

| LoudspeakerGeometry as defined in ISO/IEC 23001-8) | Channel | Azimuth [deg] | Elevation [deg] | Azimuth start angle of sector [deg] | Azimuth end angle of sector [deg] | Elevation start angle of sector [deg] | Elevation end angle of sector [deg] | Ch. is LFE | Position is relative |
|---|---|---|---|---|---|---|---|---|---|
| 43 | CH_I_CNTR | 0 | 0 | 0 | 0 | 0 | 0 | 0 | 0 |
| 44 | CH_I_LFE | 0 | n/a | n/a | n/a | n/a | n/a | 1 | 0 |
| 45 | CH_I_LEFT | 30 | 0 | 30 | 30 | 0 | 0 | 0 | 0 |
| 46 | CH_I_RIGHT | −30 | 0 | −30 | −30 | 0 | 0 | 0 | 0 |

CH_I_LFE is the woofer channel located at an elevation angle of 0°, and CH_I_CNTR corresponds to a channel located at an elevation angle of 0° and an azimuth angle of 0°. CH_I_LFET corresponds to a channel located at an elevation angle of 0° and an azimuth angle within a sector between 30° to 60° at left side, and CH_I_RIGHT corresponds to a channel located at an elevation angle of 0° and an azimuth angle within a sector from 30° to 60° at right side.

Here, newly defined locations of the internal channels are absolute locations with respect to a reference point, not relative locations with the other channels.

The internal channel may be applied to a case of quadruple channel element (QCE) including pairs of CPEs (will be described later).

The method of generating the internal channel may be implemented in two manners.

One is a pre-processing method in an MPEG-H 3D audio encoder, and the other is a post-processing method in an MPEG-H 3D audio decoder.

When the internal channel is used in the MPEG, Table 5 may be added to ISO/IEC 23008-3 Table 90 as a new row.

Table 6 shows a format converter output channel corresponding to an internal channel type and gain and EQ index to be applied to each output channel, according to an embodiment.

TABLE 6

| Source | Destination | Gain | EQ_index |
|---|---|---|---|
| CH_I_CNTR | CH_M_L030, CH_M_R030 | 1.0 | 0 (off) |
| CH_I_LFE | CH_M_L030, CH_M_R030 | 1.0 | 0 (off) |
| CH_I_LEFT | CH_M_L030 | 1.0 | 0 (off) |
| CH_I_RIGHT | CH_M_L030 | 1.0 | 0 (off) |

In order to use the internal channel, an additional rule as illustrated in Table 6 has to be added to the format converter.

An internal channel signal is generated taking into account gains and EQ values of the format converter. Therefore, as shown in Table 6, the internal channel signal may be generated by using the additional conversion rule, in which a gain value is 1 and an EQ index is 0.

When the internal channel type is CH_I_CNTR corresponding to the center channel or CH_I_LFE corresponding to the woofer channel, the output channels are CH_M_L030 and CH_M_R030. Here, the gain value is determined as 1 and the EQ index is determined as 0, and since two stereo output channels are both used, each output channel signal has to be multiplied by $1/\sqrt{2}$ in order to maintain power of the output signal.

When the internal channel type is CH_I_LEFT corresponding to the left channel, the output channel is CH_M_L030. Here, the gain value is determined as 1 and the EQ index is determined as 0, and since the left output channel is only used, a gain 1 is applied to CH_M_L030 and a gain 0 is applied to CH_M_R030.

When the internal channel type is CH_I_RIGHT corresponding to the right channel, the output channel is CH_M_R030. Here, the gain value is determined as 1 and the EQ index is determined as 0, and since the right output channel is only used, a gain 1 is applied to CH_M_R030 and a gain 0 is applied to CH_M_L030.

Here, in a case of an SCE channel, etc., in which the internal channel and the input channel is identical, a general format conversion rule is applied.

When the internal channel is used in the MPEG, Table 6 may be added to ISO/IEC 23008-3 Table 96 as a new row.

Tables 7 to 12 show the existing rules that have to be changed in order to use the internal channel in MPEG. Hereinafter, bitstream configurations and syntax that have to be changed or added in order to process the internal channel will be described with reference to Tables 7 to 12.

Table 7 shows a speakerLayoutType according to an embodiment of the present invention.

In order to process the internal channel, a speaker layout type speakerLayoutType for the internal channel has to be defined. Table 7 illustrates meaning of each value of speakerLayoutType.

TABLE 7

| Value | Meaning |
|---|---|
| 0 | Loudspeaker layout is signaled by means of ChannelConfiguration index as defined in ISO/IEC 23001-8. |
| 1 | Loudspeaker layout is signaled by means of a list of LoudspeakerGeometry indices as defined in ISO/IEC 23001-8 |
| 2 | Loudspeaker layout is signaled by means of a list of explicit geometric position information. |
| 3 | Loudspeaker layout is signaled by means of LCChannelConfiguration index. Note that the LCChannelConfiguration has same layout with ChannelConfiguration but different channel orders to enable the optimal internal channel structure using CPE. |

In a case where speakerLayoutType==3, Loudspeaker layout is signaled by the meaning of LCChannelConfiguration index. Although LCChannelConfiguration has the same layout as that of ChannelConfiguration, LCChannelConfiguration has a channel allocation order enabling an optimal internal channel structure using the CPE.

Table 8 shows syntax of SpeakerConfig3d( ) according to an embodiment of the present invention.

TABLE 8

| Syntax | No. of bits | Mnemonic |
|---|---|---|
| SpeakerConfig3d( ) { | | |
|     speakerLayoutType; | 2 | uimsbf |
|     if (speakerLayoutType == 0 \|\| speakerLayoutType == 3) { | | |
|         CICPspeakerLayoutIdx; | 6 | uimsbf |
|     } | | |
|     else { | | |
|         numSpeakers = escapedValue(5, 8, 16) + 1; | | |
|         if (speakerLayoutType == 1 ) { | | |
|             for (i = 0; i < numSpeakers; i++ { | | |
|                 CICPspeakerIdx; | 7 | uimsbf |
|             } | | |
|         } | | |
|         if (speakerLayoutType == 2 ) { | | |
|             mpegh3daFlexibleSpeakerConfig(numSpeakers); | | |
|         } | | |
|     } | | |
| } | | |

As described above, in a case of speakerLayoutType==3, an identical layout as CICPspeakerLayoutIdx is used, but there is a difference in an optimal channel allocation order for the internal channel.

When speakerLayoutType==3 and the output layout is stereo, the input channel number Nin is changed to the number of internal channel after the core codec.

Table 9 shows immersiveDownmixFlag according to an embodiment of the present invention.

Since the speaker layout type for the internal channel is newly defined, immersiveDownmixFlag also has to be corrected. When immersiveDownmixFlag is 1, a syntax for processes in a case of speakerLayoutType==3 has to be added as shown in Table 12.

An object spreading has to satisfy following conditions:
Local loud speaker setting is signaled by Loudspeaker-Rendering( )
the speakerLayoutType has to be 0 or 3; and
CICPspeakerLayoutIdx has a value of one of 4, 5, 6, 7, 9, 10, 11, 12, 13, 14, 15, 16, 17, and 18.

TABLE 9

| immersive-DownmixFlag | Meaning |
|---|---|
| 0 | Generic format converter shall be applied as defined in clause 10. |
| 1 | If the local loudspeaker setup, signaled by LoudspeakerRendering( ), is signaled as<br>(speakerLayoutType==0 or 3,CICPspeaker-LayoutIdx==5)<br>or as<br>(speakerLayoutType==0 or 3,CICPspeaker-LayoutIdx==6),<br>independently of potentially signaled loudspeaker displacement angles, then immersive rendering format converter shall be applied as defined in clause 11. |

TABLE 9-continued

| immersive-DownmixFlag | Meaning |
|---|---|
| | In all other case the generic format converter shall be applied as defined in clause 10. |

Table 10 shows syntax of SAOC3DgetNumChannels( ) according to an embodiment of the present invention.

SAOC3DgetNumChannels has to be corrected to include a case of speakerLayoutType==3 as illustrated in Table 10.

TABLE 10

| Syntax | No. of bits | Mnemonic |
|---|---|---|
| SAOC3DgetNumChannels(Layout) | | Note 1 |
| { | | |
|     numChannels = numSpeakers; | | Note 2 |
|     for (i = 0; i < numSpeakers; i++) { | | |
|         if (Layout.isLFE[i] == 1){ | | |
|             numChannels = numChannels − 1; | | |
|         } | | |
|     } | | |
|     return numChannels: | | |
| } | | |

Note 1:
The function SAOC3DgetNumChannels( ) returns the number of available non-LFE channels numChannels.
Note 2:
numSpeakers is defined in Syntax of SpeakerConfig3d( ). If speakerLayoutType == 0 or speakerLayoutType == 3 numSpeakers represents the number of loudspeakers corresponding to the ChannelConfiguration value, CICPspeakerLayoutIdx, as defined in ISO/IEC 23001-8.

Table 11 shows a channel allocation order according to an embodiment of the present invention.

Table 11 illustrates channel allocation order that is newly defined for the internal channel, and represents the number of channels, the order of channels, and allowable internal channel types according to loud speaker layout or LCChannelConfiguration.

TABLE 11

| Loudspeaker Layout Index or LCChannelConfiguration | Number of Channels | Channels (with ordering) | | Possible Internal Channel Type |
|---|---|---|---|---|
| 1 | 1 | CH_M_000 | | Center |
| 2 | 2 | CH_M_L030, | | Left |
| | | CH_M_R030 | | Right |

TABLE 11-continued

| Loudspeaker Layout Index or LCChannelConfiguration | Number of Channels | Channels (with ordering) | Possible Internal Channel Type |
|---|---|---|---|
| 3 | 3 | CH_M_000, | Center |
|  |  | CH_M_L030, | Left |
|  |  | CH_M_R030 | Right |
| 4 | 4 | CH_M_000, CH_M180, | Center |
|  |  | CH_M_L030, | Left |
|  |  | CH_M_R030 | Right |
| 5 | 5 | CH_M_000, | Center |
|  |  | CH_M_L030, CH_M_L110, | Left |
|  |  | CH_M_R030, CH_M_R110 | Right |
| 6 | 6 | CH_M_000, | Center |
|  |  | CH_LFE1, | Left |
|  |  | CH_M_L030, CH_M_L110, | Left |
|  |  | CH_M_R030, CH_M_R110 | Right |
| 7 | 8 | CH_M_000, | Center |
|  |  | CH_LFE1, | Left |
|  |  | CH_M_L030, CH_M_L110, CH_M_L060, | Left |
|  |  | CH_M_R030, CH_M_R110, CH_M_R060 | Right |
| 8 |  | n.a. |  |
| 9 | 3 | CH_M_180, | Center |
|  |  | CH_M_L030, | Left |
|  |  | CH_M_R030, | Right |
| 10 | 4 | CH_M_L030, CH_M_L110, | Left |
|  |  | CH_M_R030, CH_M_R110 | Right |
| 11 | 7 | CH_M_000, CH_M_180, | Center |
|  |  | CH_LFE1, | Left |
|  |  | CH_M_L030, CH_M_L110, | Left |
|  |  | CH_M_R030, CH_M_R110 | Right |
| 12 | 8 | CH_M_000, | Center |
|  |  | CH_LFE1, | Left |
|  |  | CH_M_L030, CH_M_L110, CH_M_L135, | Left |
|  |  | CH_M_R030, CH_M_R110, CH_M_R135 | Right |
| 13 | 24 | CH_M_000, CH_L_000, CH_U_000, | Center |
|  |  | CH_T_000, CH_M_180, CH_T_180, | Left |
|  |  | CH_LFE2, CH_LFE3, | Left |
|  |  | CH_M_L135, CH_U_L135, CH_M_L030, CH_L_L045, | Right |
|  |  | CH_M_L090, CH_U_L090, CH_M_L060, CH_U_L045, |  |
|  |  | CH_M_R135, CH_U_R135, CH_M_R030, CH_L_R045, |  |
|  |  | CH_M_R090, CH_U_R090, CH_M_R060, CH_U_R045 |  |
| 14 | 8 | CH_M_000, | Center |
|  |  | CH_LFE1, | Left |
|  |  | CH_M_L030, CH_M_L110, CH_U_L030, | Left |
|  |  | CH_M_R030, CH_M_R110, CH_U_R030 | Right |
| 15 | 12 | CH_M_000, CH_U_180, | Center |
|  |  | CH_LFE2, CH_LFE3, | Left |
|  |  | CH_M_L030, CH_M_L135, CH_M_L090, CH_U_L045, | Left |
|  |  | CH_M_R030, CH_M_R135, CH_M_R090, CH_U_R045 | Right |
| 16 | 10 | CH_M_000, | Center |
|  |  | CH_LFE1, | Left |
|  |  | CH_M_L030, CH_M_L110, CH_U_L030, CH_U_110, | Left |
|  |  | CH_M_R030, CH_M_R110, CH_U_R030, CH_U_R110 | Right |
| 17 | 12 | CH_M_000, CH_U_000, CH_T_000, | Center |
|  |  | CH_LFE1, | Left |
|  |  | CH_M_L030, CH_M_L110, CH_U_L030, CH_U_L110, | Left |
|  |  | CH_M_R030, CH_M_R110, CH_U_R030, CH_U_R110 | Right |
| 18 | 14 | CH_M_000, CH_U_000, CH_T_000, | Center |
|  |  | CH_LFE1, | Left |
|  |  | CH_M_L030, CH_M_L110, CH_M_L150, | Left |
|  |  | CH_U_L030, CH_U_L110, |  |
|  |  | CH_M_R030, CH_M_R110, CH_M_R150, | Right |
|  |  | CH_U_R030, CH_U_R110 |  |
| 19 | 12 | CH_M_000, | Center |
|  |  | CH_LFE1, | Left |
|  |  | CH_M_L030, CH_M_L135, CH_M_L090, | Left |
|  |  | CH_U_L030, CH_U_L135, |  |
|  |  | CH_M_R030, CH_M_R135, CH_M_R090, | Right |
|  |  | CH_U_R030, CH_U_R135 |  |
| 20 | 14 | CH_M_000, | Center |
|  |  | CH_LFE1, | Left |
|  |  | CH_M_L030, CH_M_L135, CH_M_L090, CH_U_L045, | Left |
|  |  | CH_U_L135, CH_M_LSCR, |  |
|  |  | CH_M_R030, CH_M_R135, CH_M_R090, CH_U_R045, | Right |
|  |  | CH_U_R135, CH_M_RSCR |  |

Table 12 shows syntax of mpegh3daChannelPairElementConfig( ) according to an embodiment of the present invention.

For processing the internal channel, when stereoConfigIndex is greater than 0 as illustrated in Table 15, a process Mps212Config( ) is performed, and after that, mpegh3daChannelPairElementConfig( ) has to be corrected so as to process isInternal Channel Processed( ).

multiplied by a plurality of "fixed" gain values and EQ values defined in the conversion rule matrix, (2) an upmixing process and a mixing process are necessary, and (3) a power regulation process is necessary, and thus, the calculation amount needs to be further reduced.

Therefore, based on a factor that one piece of CLD data may be applied to a plurality of QMF sub-band samples, the internal channel gain may be defined based on the CLD data.

TABLE 12

| Syntax | No. of bits | Mnemonic |
|---|---|---|
| mpegh3daChannelPairElementConfig(sbrRatioIndex) | | |
| { | | |
|     mpegh3daCoreConfig( ); | | |
|     if (enhancedNoiseFilling) { | | |
|         igfIndependentTiling; | 1 | bslbf |
|     } | | |
|     if (sbrRatioIndex > 0){ | | |
|         SbrConfig( ); | | |
|         stereoConfigIndex; | 2 | uimsbf |
|     } else { | | |
|         stereoConfigIndex = 0; | | |
|     } | | |
|     if (stereoConfigIndex > 0) { | | |
|         Mps212Config(stereoConfigIndex); | | |
|         isInternalChannelProcessed | 1 | uimsbf |
|     } | | |
|     qceIndex; | 2 | uimsbf |
|     if(qceIndex > 0){ | | |
|         shiftIndex0; | 1 | uimsbf |
|         If(shiftIndex0 > 0) { | | |
|             shiftChannel0; | nBits[1] | |
|         } | | |
|     } | | |
|     shiftIndex1; | 1 | uimsbf |
|     if(shiftIndex1 > 0) { | | |
|         shiftChannel1; | nBits[1] | |
|     } | | |
| } | | |

[1] nBits = floor(log2(numAudioChannels + numAudioObjects + numHOATransportChannels + numSAOC-TransportChannels − 1)) + 1

Figure 4:
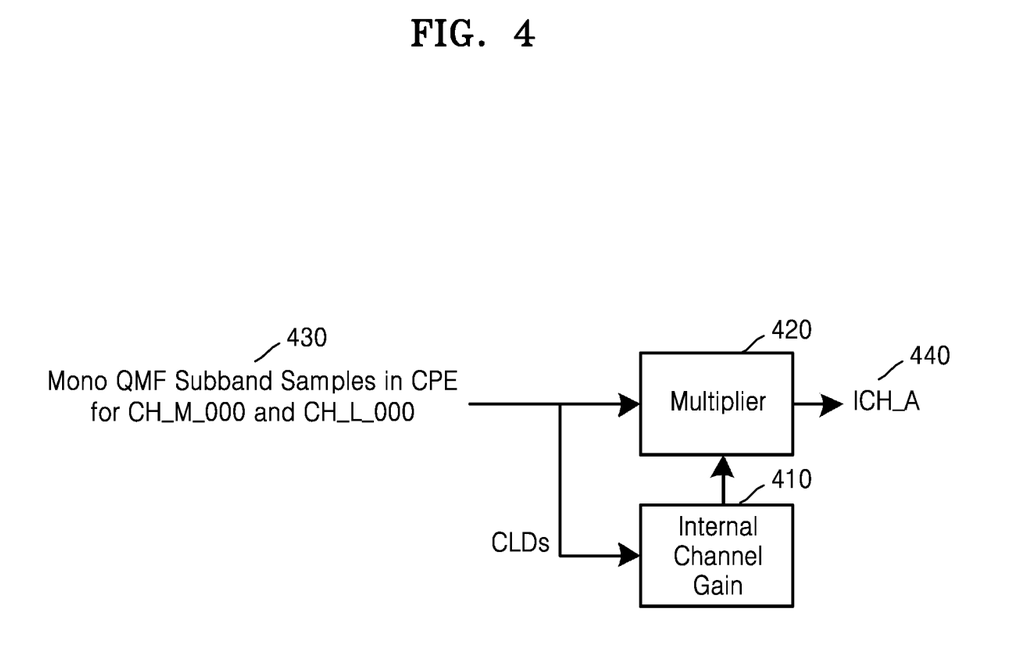
FIG. 4 is a detailed block diagram of an internal channel gain applying unit applied to an internal channel signal in a decoder, according to an embodiment of the present inventive concept.

FIG. 4 is a detailed block diagram of an internal channel gain applying unit applied to an internal channel signal in a decoder, according to an embodiment of the present invention.

In a case where an internal channel gain is applied in the decoder because conditions, that is, speakerLayout==3, isInternalProcessed is 0, and the reproduction layout is stereo, are satisfied, the internal channel process as shown in FIG. 4 is performed.

The internal channel gain applying unit shown in FIG. 4 includes an internal channel gain obtainer 410 and a multiplier 420.

When it is assumed that an input CPE includes a pair of CH_M_000 and CH_L_000 channels, the internal channel gain obtainer 410 obtains the internal channel gain by using a CLD when mono-QMF sub-band samples 430 with respect to the corresponding CPE are input. The multiplier 420 multiplies the received mono-QMF sub-band sample by the obtained internal channel gain to obtain an internal channel signal ICH-A 440.

The internal channel signal may be simply reconstructed by multiplying the mono-QMF sub-band samples with respect to the CPE by the internal channel gain $G\text{-}ICH^{l,m}$. Here, l denotes a time index and m denotes a frequency index.

As described above, by using the internal channels, the covariance calculations of the format converter may be reduced, and thus, required calculation amount is greatly reduced. However, (1) single QMF band samples have to be The internal channel gain defined based on the CLD data may cover the aforementioned three processes, and may be used in multiplication of the plurality of QMF sub-band samples. Thus, complexity of the process of generating the internal channel signal may be reduced.

When conditions that speakerLayout==3, isInternalProcesse is 0, and the reproduction layout is stereo having no deviation are satisfied, an internal channel gain $G_{ICH}^{l,m}$ Equation 1 may be defined.

$$G_{ICH}^{l,m} = \sqrt{\frac{\left(c_{left}^{l,m} \times G_{left} \times G_{EQ,left}^{m}\right)^2 + \left(c_{right}^{l,m} \times G_{right} \times G_{EQ,right}^{m}\right)^2}{\left(c_{left}^{l,m} \times G_{left} \times G_{EQ,left}^{m} + c_{right}^{l,m} \times G_{right} \times G_{EQ,right}^{m}\right)^2}} \times \left(c_{left}^{l,m} \times G_{left} \times G_{EQ,left}^{m} + c_{right}^{l,m} \times G_{right} \times G_{EQ,right}^{m}\right)$$

[Equation 1]

Here, $c_{left}^{l,m}$ and $c_{right}^{l,m}$ denote panning coefficients of CLD, $G_{left}$ and $G_{right}$ denote the gains defined in the format conversion rule, and $G_{ZQleft}^{m}$ and $G_{EQright}^{m}$ denote gains of an m-th band of the EQ defined in the format conversion rule.

By using the internal channel gain defined by Equation 1, complexity of a series of processes of (1) upmixing by using the CLD, (2) multiplying by the gain and the EQ, and (3) mixing signals of the CPE and regulating the power may be used.

Figure 5:
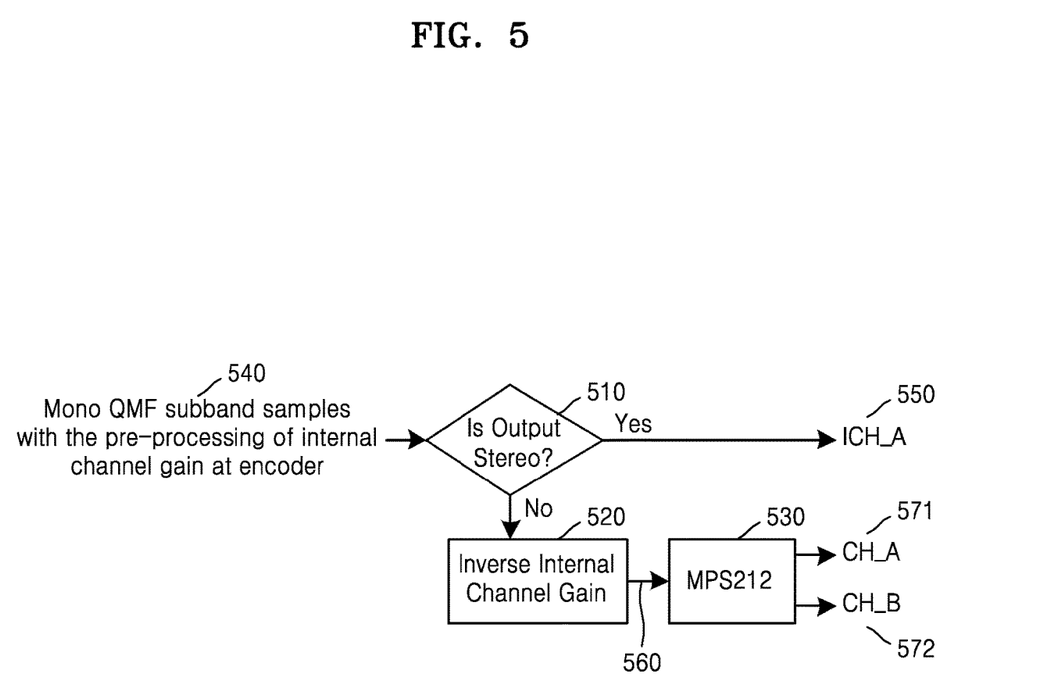
FIG. 5 is a decoding block diagram when an internal channel gain is pre-processed in an encoder, according to an embodiment of the present inventive concept.

FIG. 5 is a decoding block diagram when an internal channel gain is pre-processed in an encoder, according to an embodiment of the present invention.

In a case where the internal channel gain is applied in the encoder and transferred to the decoder because the conditions, that is, speakerLayout=3, isInternalProcessed is 1, and the reproduction layout is stereo, are satisfied, the internal channel processing as shown in FIG. 5 is performed.

When the output layout is stereo, the internal channel gain corresponding to the CPE is processed in advance in the MPEG-H 3D audio encoder, and thus, MPS212 may be bypassed in the decoder and the complexity of the decoder may be further reduced.

However, when the output layout is not the stereo, the internal channel processing is not performed, and thus, processes of multiplying a reciprocal number of the internal channel gain $$\frac{1}{G_{ICH}^{l,m}}$$

and performing MPS212 processes for restoration are necessary in the decoder.

It is assumed that the input CPE includes a pair of CH_M_000 and CH_L_000 channels, like in FIGS. 3 and 4. When the mono-QMF sub-band samples 540 on which the internal channel gain is pre-processed in the encoder are input to the decoder, the decoder determines whether the output layout is stereo (510).

If the output layout is the stereo, the internal channel is used, and thus, the received mono-QMF sub-band samples 540 are output as the internal channel signal with respect to an internal channel ICH_A 550. However, if the output layout is not the stereo, the internal channel processing does not use the internal channel, an inverse internal channel gain process 520 is performed to restore the inter channel processed signal (560), and the restored signal is MPS212 upmixed (530) to output signals about the channels CH_M_000 571 and CH_L_000 572.

In a case where the number of input channels is greater and the number of output channels is smaller, the load by the analysis of covariance to the format converter matters, and the largest decoding complexity is shown when the output layout is stereo in the MPEG-H audio.

However, in a case of another output layout rather than the stereo layout, a calculation amount added to multiply the reciprocal number of the internal channel gain corresponds to (multiplication 5 times, addition 2 times, division once, square root once≈55 calculations)×(71 bands)×(2 parameter sets)×(48000/2048)×(13 internal channels) in a case of two sets of CLDs per frame, that is, about 2.4 MOPS, which does not apply as a large load to the system.

After generating the internal channel, the QMF sub-band samples of the internal channels, the number of internal channels, and types of the internal channels are transferred to the format converter, and the number of the internal channels determines a size of the covariance analysis matrix in the format converter.

An inverse internal channel gain IG is calculated as following Equation 2, by using MPS parameters and format conversion parameters.

$$IG_{ICH}^{l,m} = \frac{1}{\sqrt{\left(c_{left}^{l,m} \times G_{left} \times G_{EQ,left}^{m}\right)^2 + \left(c_{right}^{l,m} \times G_{right} \times G_{EQ,right}^{m}\right)^2}}$$ [Equation 2]

Here, $c_{left}^{l,m}$ and $c_{right}^{l,m}$ denote dequantized linear CLD values of an l-th time slot and an m-th hybrid QMF band with respect to the CPE signal, $G_{left}$ and $G_{right}$ denote values of a gain column with respect to the output channels defined in ISO/IEC 23008-3 Table 96, that is, the format conversion rule table, and $G_{EQleft}^{m}$ and $G_{EQright}^{m}$ denote gains of an m-th band of the EQ with respect to the output channels defined in the format conversion rule table.

The embodiments of the present invention may be implemented in a form of executable program command through a variety of computer means recordable to computer readable media. The computer readable media may include solely or in combination, program commands, data files and data structures. The program commands recorded to the media may be components specially designed for the present invention or may be usable to a skilled person in a field of computer software. Computer readable record media include magnetic media such as hard disk, floppy disk, magnetic tape, optical media such as CD-ROM and DVD, magneto-optical media such as floptical disk and hardware devices such as ROM, RAM and flash memory specially designed to store and carry out programs. Program commands include not only a machine language code made by a complier but also a high level code that may be used by an interpreter etc., which is executed by a computer. The aforementioned hardware device may work as more than a software module to perform the action of the present invention and they may do the same in the opposite case.

While the invention has been shown and described with respect to the preferred embodiments, it will be understood by those skilled in the art that various changes and modification may be made without departing from the spirit and scope of the invention as defined in the following claims.

Therefore, the spirit of the present invention shall not be limited to the above-described embodiments, and the entire scope of the appended claims and their equivalents will fall within the scope and spirit of the invention.

The invention claimed is:

1. A method of processing an audio signal, the method comprising:
   receiving a channel pair element (CPE) that is encoded by using MPEG surround 212 (MPS212);
   calculating an internal channel gain with respect to the received channel pair element based on MPS212 parameters and rendering parameters including equalizer (EQ) gain values and gain values;
   generating an internal channel signal based on the received channel pair element and the calculated internal channel gain; and
   generating stereo output channel signals based on the generated internal channel signal,
   wherein the internal channel gain $G_{ICH}^{l,m}$ is calculated by using $$G_{ICH}^{l,m} = \sqrt{\left(c_{left}^{l,m} \times G_{left} \times G_{EQ,left}^{m}\right)^2 + \left(c_{right}^{l,m} \times G_{right} \times G_{EQ,right}^{m}\right)^2}$$

where l denotes a time slot index and m denotes a frequency band index,
   $c_{left}^{l,m}$ and $c_{right}^{l,m}$ are channel level difference (CLD) values for the CPE,
   $G_{left}$ and $G_{right}$ are the gain values defined in a format converter according to MPS212 output channels, and
   $G_{EQ,left}^{m}$ and $G_{EQ,right}^{m}$ are the equalizer (EQ) gain values defined in the format converter according to the MPS212 output channels.

2. The method of claim 1, wherein the audio signal is an immersive audio signal.

3. A non-transitory computer-readable recording medium having recorded thereon a program, which when executed by a computer, performs the method of claim 1.

4. An apparatus for processing an audio signal, the apparatus comprising:
- a receiver configured to receive a channel pair element that is encoded by using an MPEG surround 212 (MPS212);
- an internal channel processor configured to calculate an internal channel gain with respect to the received channel pair element based on MPS212 parameters and rendering parameters including equalizer (EQ) gain values and gain values, and to generate an internal channel signal based on the received channel pair element and the calculated internal channel gain; and
- a stereo output signal generator configured to generate stereo output channel signals based on the generated internal channel signal, wherein the internal channel gain $G_{ICH}^{l,m}$ calculated by using $$G_{ICH}^{l,m} = \sqrt{\left(c_{left}^{l,m} \times G_{left} \times G_{EQ,left}^{m}\right)^2 + \left(c_{right}^{l,m} \times G_{right} \times G_{EQ,right}^{m}\right)^2}$$

where l denotes a time slot index and m denotes a frequency band index, $c_{left}^{l,m}$ and $c_{right}^{l,m}$ are channel level difference (CLD) values for the CPE, $G_{left}$ and $G_{right}$ are the gain values defined in a format converter according to the MPS212 output channels, and $G_{EQ,left}^{m}$ and $G_{EQ,right}^{m}$ are the equalizer (EQ) gain values defined in the format converter according to the MPS212 output channels.

5. The apparatus of claim 4, wherein the audio signal is an immersive audio signal.

\* \* \* \* \*